United States Patent
Chang et al.

(10) Patent No.: US 7,718,024 B2
(45) Date of Patent: May 18, 2010

(54) LED REFLECTOR MOLDING PROCESS, CONSTRUCTION, AND LOADER THEREOF

(75) Inventors: Chen-Shing Chang, Pingjhen (TW); Jung-Hsiu Hsieh, Pingjhen (TW); Kuo Hu-Chen, Pingjhen (TW); Ching-Ya Wu, Pingjhen (TW); Min-Li Lee, Pingjhen (TW)

(73) Assignee: Elit Fine Ceramics Co., Ltd., Pingihen, Taoyuan County (TW)

( * ) Notice: Subject to any disclaimer, the term of this patent is extended or adjusted under 35 U.S.C. 154(b) by 398 days.

(21) Appl. No.: 11/707,259

(22) Filed: Feb. 16, 2007

(65) Prior Publication Data

US 2008/0008847 A1    Jan. 10, 2008

(30) Foreign Application Priority Data

Mar. 1, 2006    (TW) .............................. 95106876 A
May 19, 2006   (TW) .............................. 95117845 A

(51) Int. Cl.
*B32B 37/00* (2006.01)
*B29C 70/68* (2006.01)

(52) U.S. Cl. ................. 156/224; 156/89.12; 156/89.16; 156/212; 156/221; 156/223; 156/289; 156/323; 264/1.9; 264/263; 264/267; 264/510; 264/544; 428/137; 428/138; 428/139; 428/161; 428/164

(58) Field of Classification Search ................. 156/224, 156/89.12
See application file for complete search history.

(56) References Cited

U.S. PATENT DOCUMENTS

| | | | | |
|---|---|---|---|---|
| 4,106,859 A | * | 8/1978 | Doriguzzi et al. | 349/113 |
| 4,337,997 A | * | 7/1982 | Sadoune et al. | 359/848 |
| 4,737,208 A | * | 4/1988 | Bloechle et al. | 156/90 |
| 5,538,582 A | * | 7/1996 | Natarajan et al. | 156/285 |
| 2005/0093146 A1 | * | 5/2005 | Sakano | 257/730 |
| 2006/0006405 A1 | * | 1/2006 | Mazzochette | 257/99 |

* cited by examiner

*Primary Examiner*—David R Sample
*Assistant Examiner*—Jeff A Vonch
(74) *Attorney, Agent, or Firm*—Jackson IPG PLLC

(57) ABSTRACT

A light emitting diode reflector molding process, and a construction thereof includes preparation of a first and a second green sheet structures, the first green sheet structure being provided with a first pattern; the second green sheet structure being placed on top of the first green sheet structure; a metallic layer being coated on the second green sheet structure, the second green sheet structure being molded along the opening pattern of and covering upon the first green sheet for the metallic layer to become the wall of the reflector opening.

6 Claims, 16 Drawing Sheets

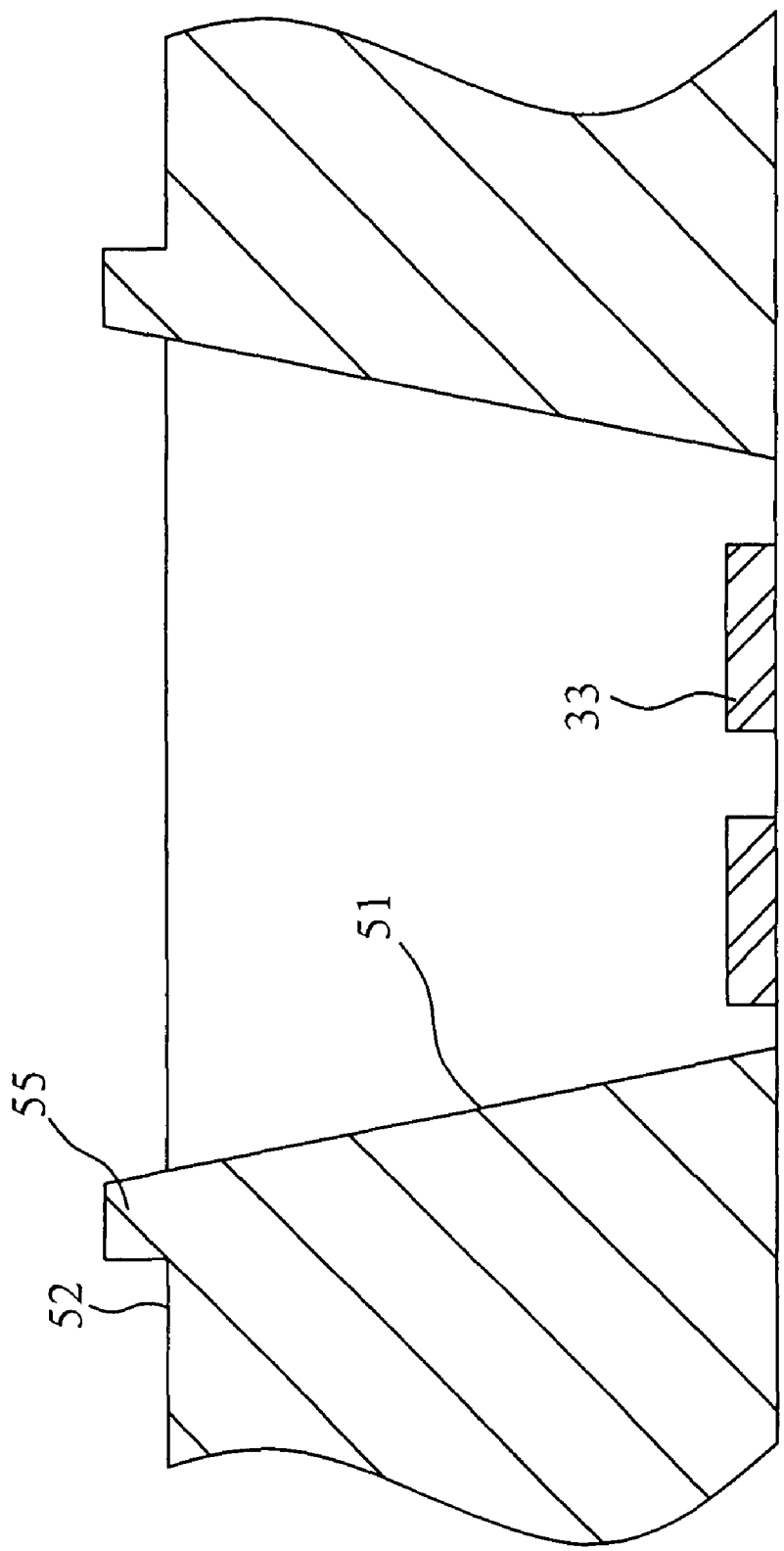

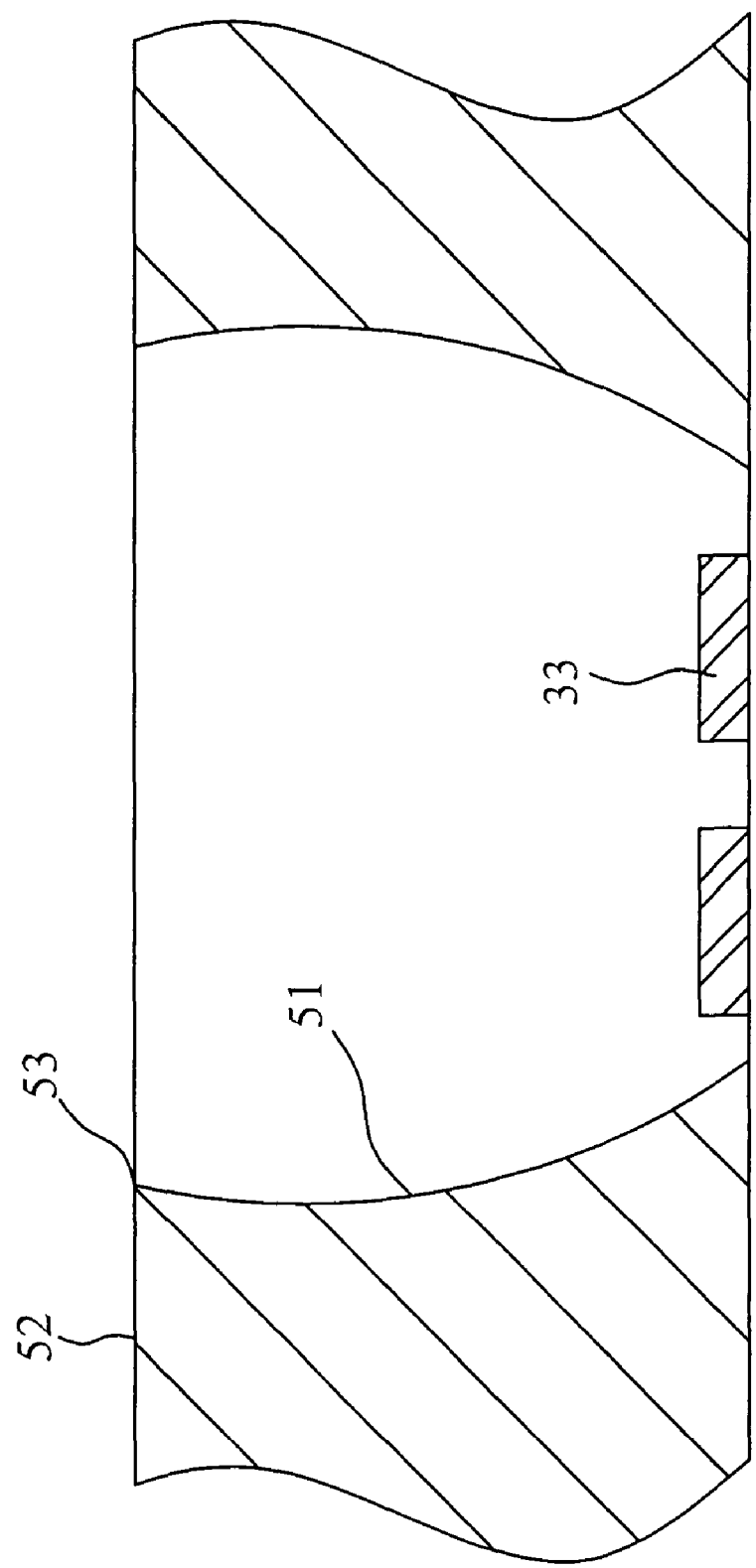

LED REFLECTOR MOLDING PROCESS, CONSTRUCTION, AND LOADER THEREOF

BACKGROUND OF THE INVENTION (a) Field of the Invention

The present invention is related to a molding process of a light emitting diode (LED) reflector, its construction, and the reflector-applied LED loader, and more particularly, to a molding process of an LED ceramic reflector with variable LED loading angles.

(b) Description of the Prior Art

Light emitting diode (LED) for compact in size, lower power consumption, low heat generation, and long service lift has gradually exited the conventional tungsten lamp of the similar function as found in Xmas light, flashlight, vehicle signal light, and traffic mark. An LED is essentially comprised of a transparent package containing conductive terminals of different polarities and a loader; a chip is disposed on the load; an electrode layer of the chip and those conductive terminals are connected to each other by means of a gold plated wire; and each conductive terminal extends out of the transparent package to become a contact to a power source.

A chemical compound semiconductor in the LED chip essentially decides spectrum or luminance characteristics of the LED. Optical characteristics of the LED including light emitting luminance or angle of filed of view are significantly subject to package substrate of the LED.

In a construction of an LED of the prior art, a reflector operates to reflect light emitted by the LED. Generally, the reflector is provided using the drilling, punching or laminating method. However, any of these methods is blamed for higher cost, rough inclined plane being detrimental to the pattern of light reflection, opening shape being limited, and prevention from producing packed circuits. As a result, efforts for reducing packaging cost of the LED and for improving the light selection efficiency of the LED are frustrated.

SUMMARY OF THE INVENTION

The primary purpose of the present invention is to provide an LED reflector molding process to solve the problem of difficult shaping of the reflector as found with the prior art. The molding process of the present invention for an LED reflector involves the formation of a metallic layer, a printed reflective silver layer inter alia, on a green sheet structure by using a thick film printing method to substitute a film coating technology used in the prior art while upgrading light selection efficiency of the LED; a hot laminating method is employed to the reflector essentially comprised of a ceramic green sheet for the production of a reflector with its opening shape and angle meeting design requirements of the LED light emitting shape.

To achieve the purpose, a first green sheet and a second green sheet are prepared with both sheets respectively provided with a first opening pattern and a second opening pattern. Wherein, the porosity of the second opening pattern is smaller than that of the first opening pattern. The second green sheet structure is placed on the first green sheet structure to locate the second opening pattern on the first opening pattern to overlap both patterns. The second green sheet structure is coated with a metallic layer. Finally, the second green sheet structure is molded and covers upon the first green sheet structure along the opening patter of the first green sheet structure.

Another purpose of the present invention is to provide a construction of the LED reflector essentially having the circuit connection between the reflector and electrodes of a ceramic base as the primary structure; a metallic admixture is fixed to the ceramic base by hard soldering, high polymer adhesive or glass sealing; a metallic admixture and a ceramic of approximate heat expansion coefficient are selected for combination to reduce heat stress.

BRIEF DESCRIPTION OF THE DRAWINGS

FIGS. 9(A), 9(B), and 9(C) are sectional views showing various fixed slopes of the inner wall of the reflector of the present invention.

FIGS. 10(A), 10(B), and 10(C) are sectional view showing various curvatures of the inner wall of the reflector of the present invention.

DETAILED DESCRIPTION OF THE PREFERRED EMBODIMENTS

Figure 1:
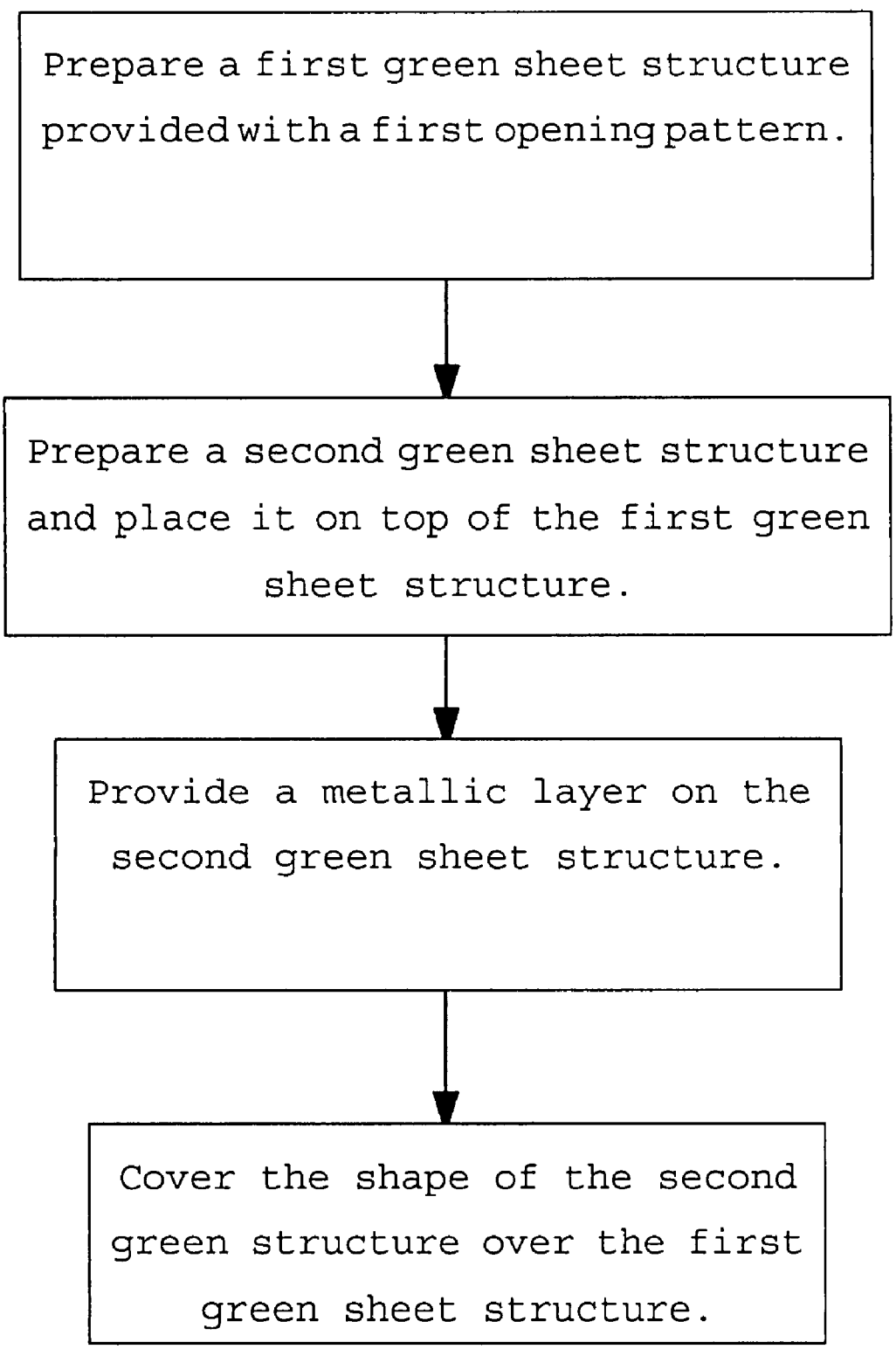
FIG. 1 is a flow chart showing an LED molding process of the present invention.
Figure 2:
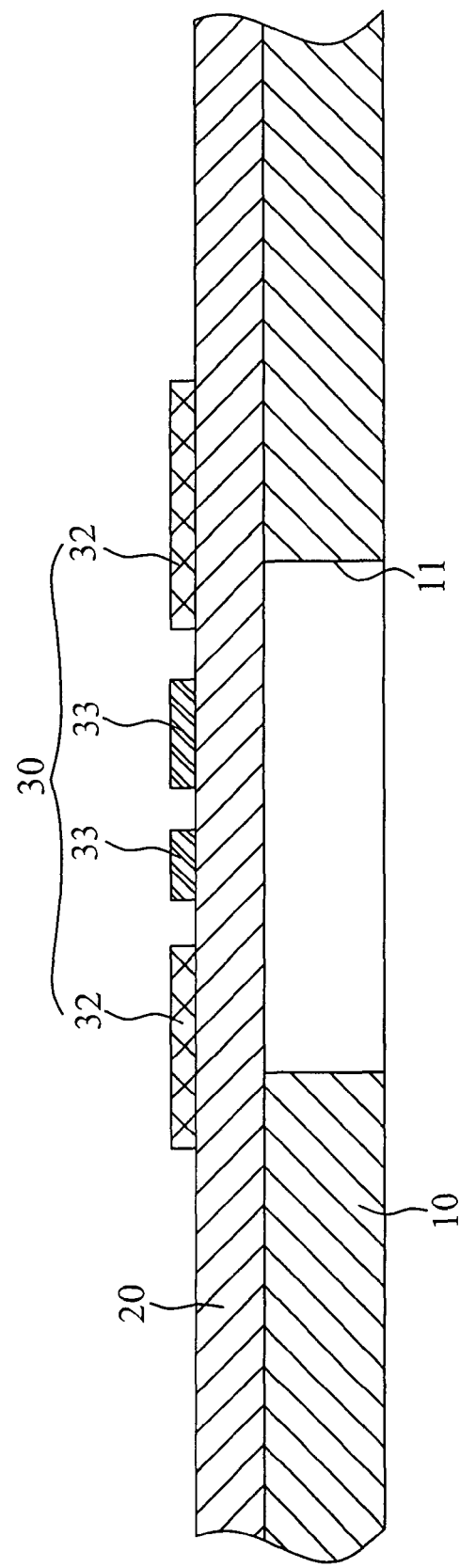
FIG. 2 is a sectional view showing a reflector material structure of a preferred embodiment of the present invention.
Figure 3:
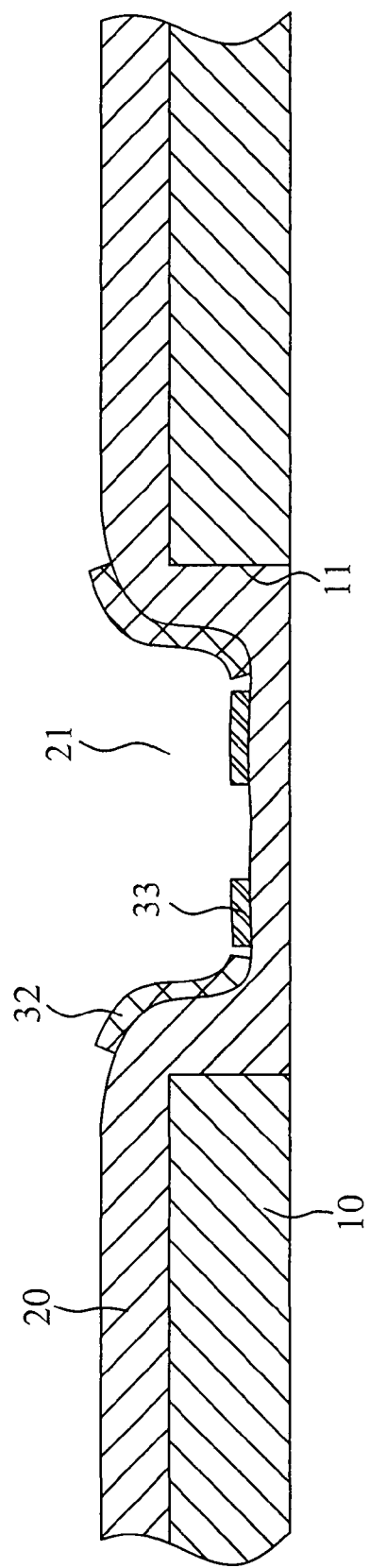
FIG. 3 is a sectional view showing a molded structure of the LED of the present invention.

The present invention is related to a light emitting diode (LED) reflector molding process, a reflector construction, and a loader thereof. As illustrated in FIG. 1, The present invention is related to a light emitting diode (LED) reflector molding process, a reflector construction and a loader. As illustrated in FIG. 1, an LED reflector molding process includes multiple steps. Step 1 involves preparation of a first green sheet structure provided with a first opening patter; a second green sheet structure is placed on top of the first green sheet structure in Step 2; a metallic layer is placed on top of the second green sheet structure in Step 3; and in Step 4 the second green sheet structure is molded and covers upon the first green sheet structure along the first opening pattern of the first green sheet structure. According to a preferred embodiment of the present invention as also illustrated in FIG. 2, the reflector material structure includes a first green sheet structure 10 and a second green sheet structure 20. The first green sheet structure 10 is provided with a first opening pattern 11; and the second green sheet structure 20 is placed on top of the first green sheet structure 10. A metallic structure 30 is disposed on the second green sheet structure 20 at where in relation to the first opening pattern 11; and the first and the second green sheet structures 10 and 20 are bound to each other using a thermal molding or laminating method to such that the metallic structure 30 becomes a sidewall and a bottom of the first opening pattern 11 as illustrated in FIG. 3. Once both of the first and the second green sheet structures 10 and 20 are bound to each other, the second green sheet structure 20 covers upon the first green sheet structure 10 by following the shape of the first green sheet structure 10 and is further molded into a fourth opening pattern 21 along the first opening pattern 11. The metallic structure 20 is disposed at where in relation to the bottom of the fourth opening pattern 21 to function as an electrode portion, or as illustrated, the metallic structure is disposed on the sidewall and the bottom of the fourth opening pattern 21 to respectively function as a reflective sidewall and an electrode portion.

Figure 4:
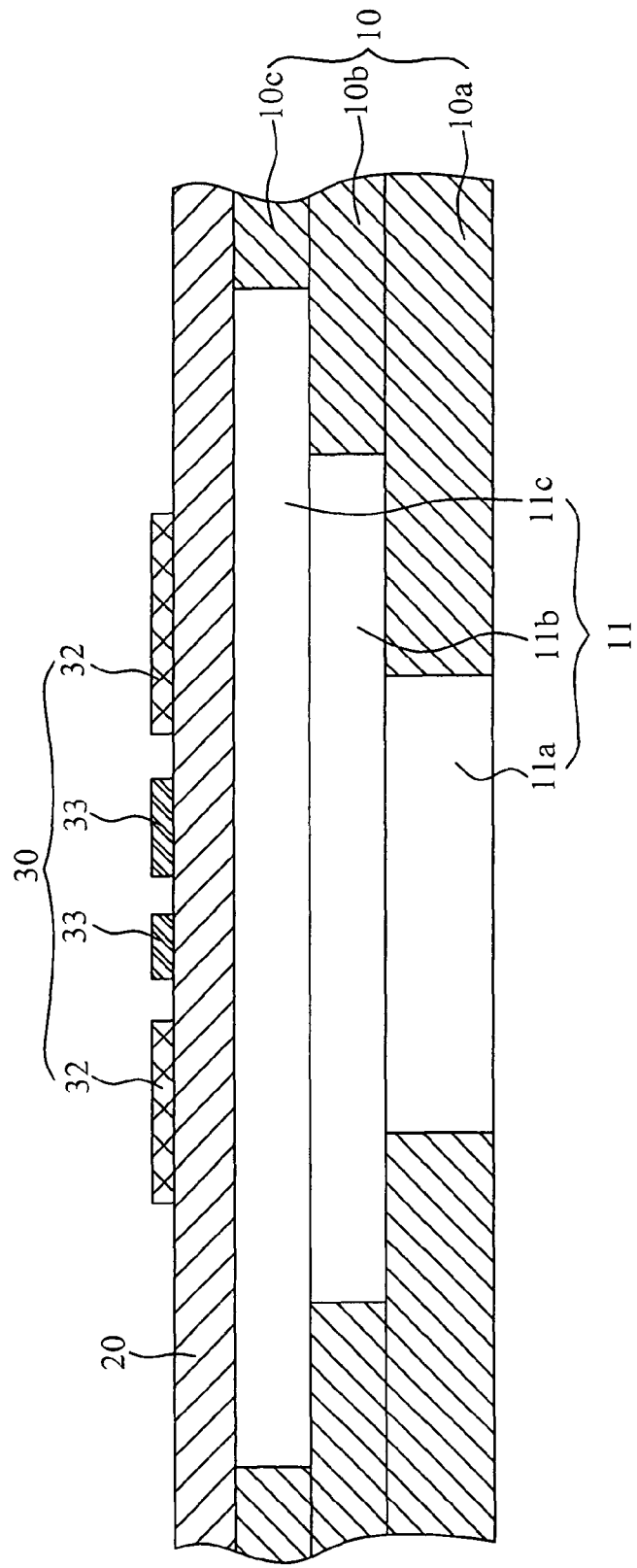
FIG. 4 is a sectional view showing a reflector material structure of another preferred embodiment of the present invention.
Figure 5:
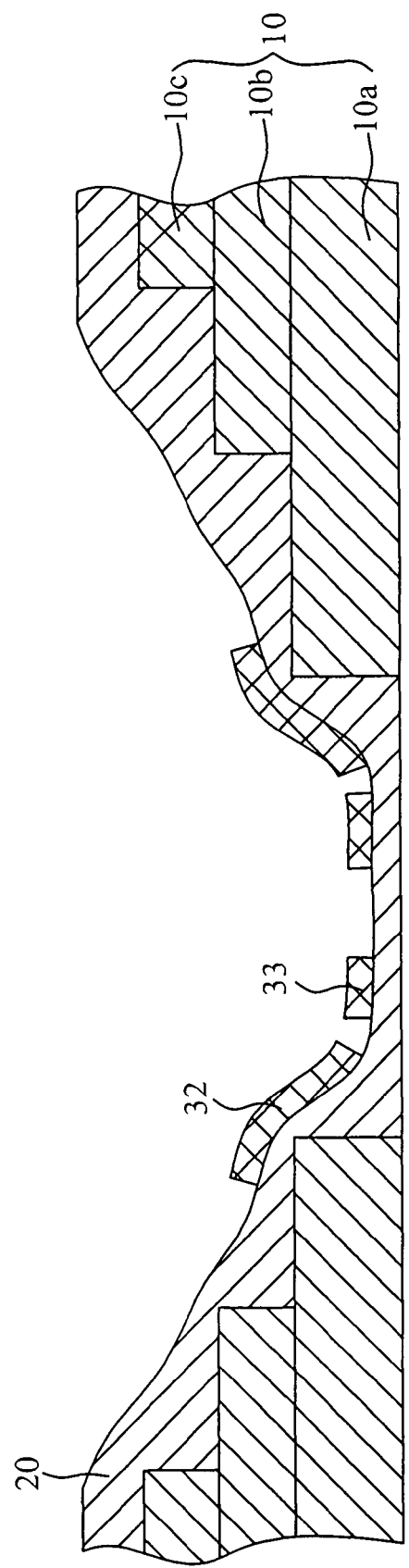
FIG. 5 is a sectional view showing another molded structure of the LED of the present invention.

Referring to a second preferred embodiment of the present invention as illustrated in FIGS. 4 and 5, the first green sheet structure 10 is related to a pack comprised of multiple layers of ceramic green sheet 10a, 10b, and 10c provided with a pack comprised of openings 11a, 11b, and 11c respectively to those layers of ceramic green sheet 10a, 10b, and 10c. The pack comprised of openings 11a, 11b, and 11c constitutes the first opening pattern 11. In this preferred embodiment, the number of the ceramic green sheet structures included in the first green sheet structure varies depending on the depth of the reflector desired. The geometric form of those openings 11a, 11b, and 11c may be each related to a circle, oval, regular polygonal, polygonal, or any of their combinations depending on that desired for the reflector. Furthermore, according to the form of the opening and angle of the reflector designed, the size of each opening 11a, 11b, and 11c may be the same or different from one another.

A surface of the second green sheet structure 20 is coated with a metallic structure 30. In this preferred embodiment, a silver layer is coated on certain part of the surface by using a thick film printing method; or alternatively, after the first and the second green sheet structures are sintered together to form a conductive or reflective layer, a plated layer is formed on the metallic structure on the surface of the second green sheet structure by using a plating method to increase light reflective efficiency.

Figure 6:
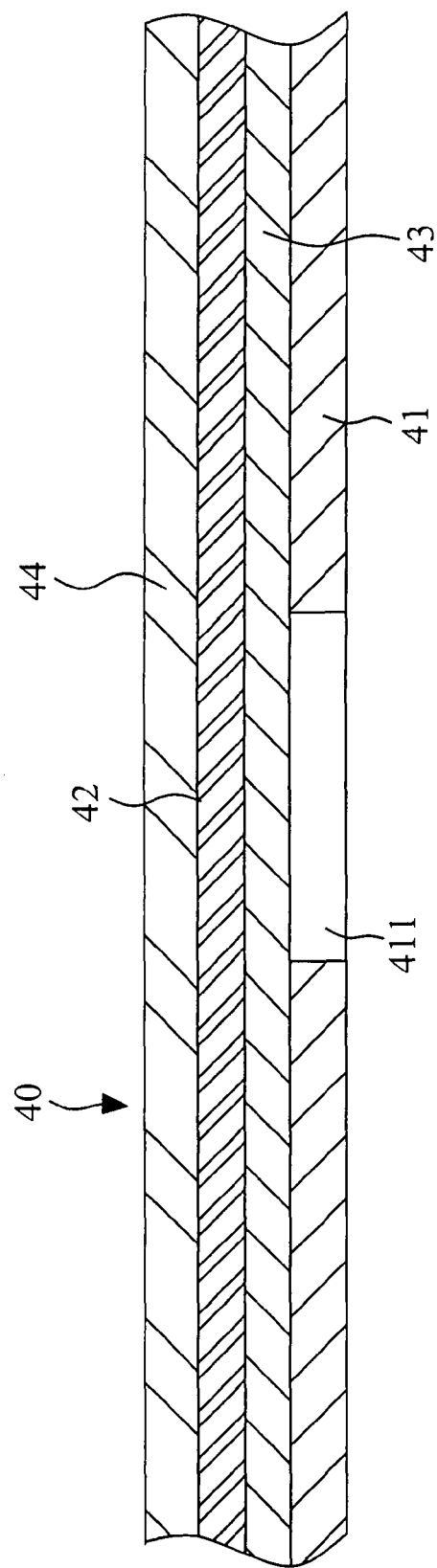
FIG. 6 is a sectional view showing a molding structure of the present invention.

The metallic structure 30 includes a reflective portion 32 and an electrode portion 33 with both portions electrically insulated from each other. Upon completing the heating or laminating step, the reflective portion 32 and the electrode portion 33 are distributed within the scope of the first opening pattern 11 and respectively become a sidewall and a bottom of the first opening pattern so that a molding structure is provided on the second green sheet structure by using a thermal molding or laminating method in the preferred embodiment. As illustrated in FIG. 6, the molding structure 40 includes a flat layer 43 disposed between a first release film 41 and a second release film 42 and a buffer layer 44 disposed on the second release film 42. Both of the first and the second release films 41 and 42 are each related to a polyester film. The first release film 41 contacts the metallic structure 30 and the second green sheet structure 20, and is provided with a second opening pattern 411 in porosity same as or different from that of the first opening pattern for stripping after the molding process. The second opening pattern 411 is overlapped with the first opening patter 11 of the first green sheet structure. The flat layer 43 is related to a hard sheet giving its hardness, strength, or rigidity higher than that of the first release film 41 or the second release film 42 to such that a reflective plan of the reflector is flushed with the bottom while compressing flushed with the reflector material structure in the molding process. The flat layer 43 is also provided with a third opening patter 431 in porosity same as or different from that of the first opening pattern. The second release film 42 relates to a film without any opening and is made in a thickness or of a material different from that of the first release film 41 for molding purpose. The buffer layer 44 is related to an epoxy layer to help sustain pressure.

Figure 7:
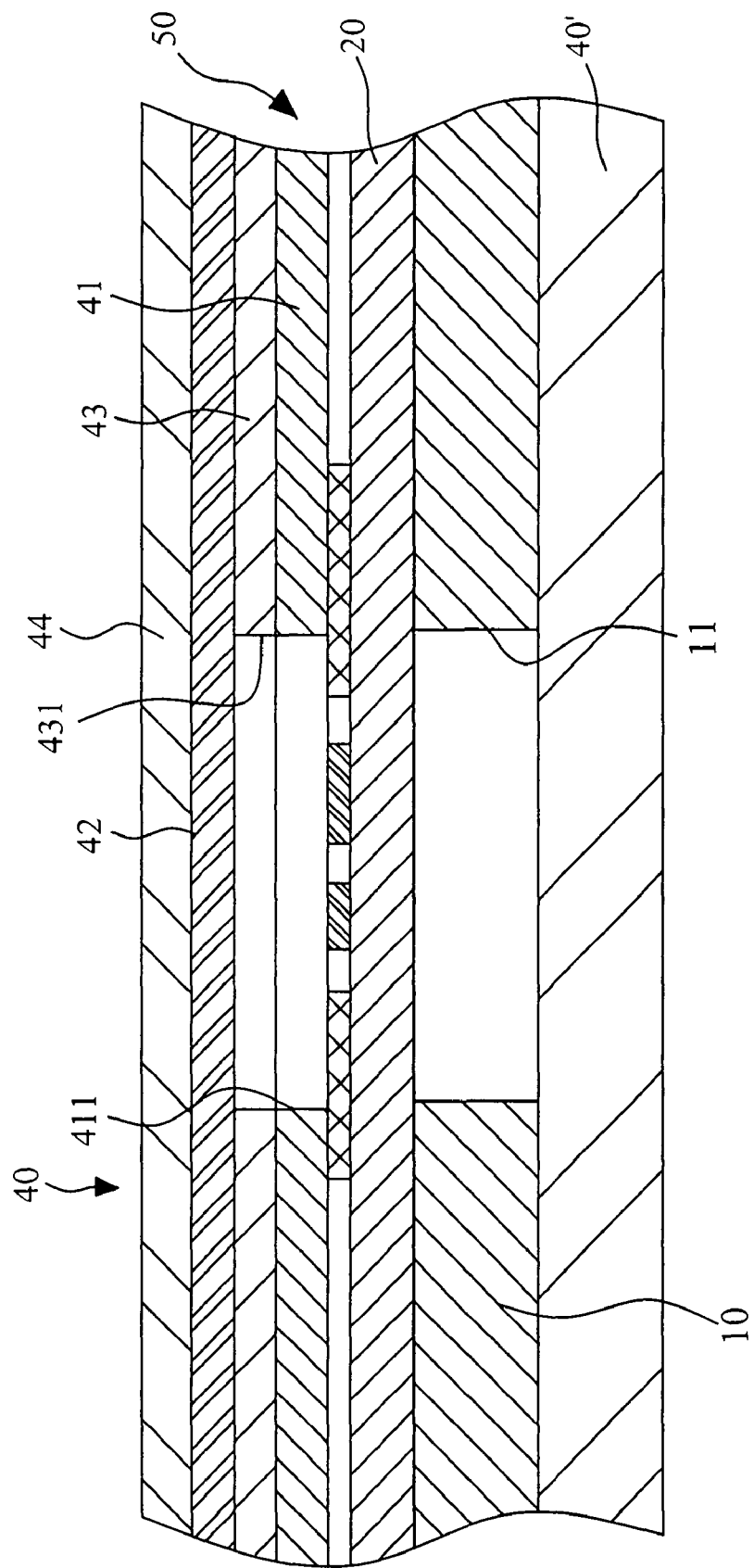
FIG. 7 is a sectional view showing a pack of a reflector material structure and the molding structure of the present invention.
Figure 8:
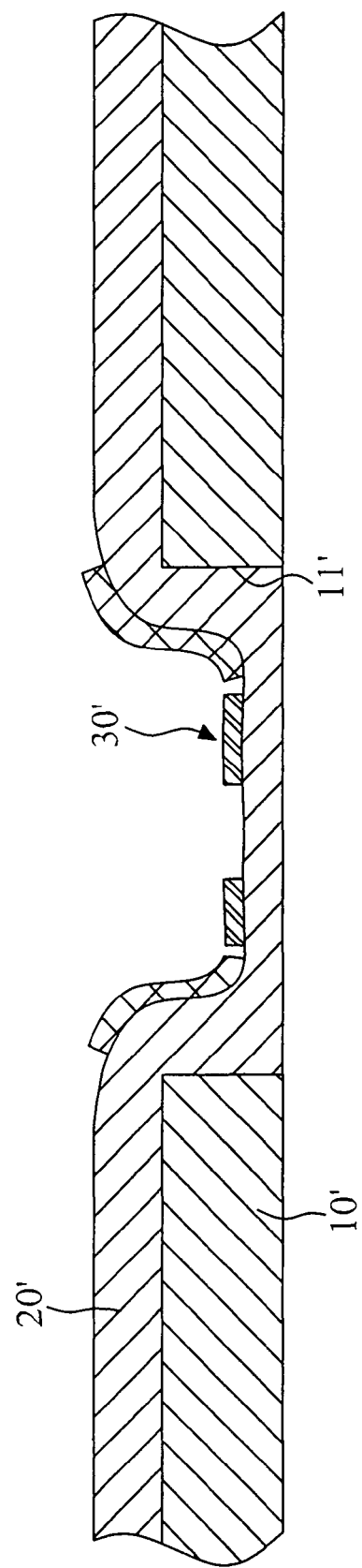
FIG. 8 is a sectional view of the reflector of the present invention.

According to another preferred embodiment yet of the present invention as illustrated in FIG. 7, both of the first and the second green structures 10 and 20 of the reflector material structure are packed between two molding structures 40 and 40'. Wherein, multiple layers, e.g., a buffer layer and a flat layer, of the molding structure 40' are in sequence secured to a locating pin or a pin position; and then both of the first and the second green sheet structures are packed and also secured to the locating pin or pin position. Wherein, a metallic layer has been already formed. Those multiple layers from another molding structure are then placed and secured to complete a pack structure 50. The pack structure 50 is wrapped up in a blistered pack (not illustrated) to receive the process of hot isostatic press (HIP). During the HIP process, the second green sheet structure and the metallic structure gradually collapse in the direction of the molding structure to from the shape of the opening and the angle needed by the reflector while the sidewall of the reflector and the edge of the opening is molded simultaneously to form a reflector structure as illustrated in FIG. 8. The base layer of the reflector relates to a first ceramic structure 10' provided with a first opening pattern 11' while the formation layer relates to a second ceramic structure 20' to be placed on the first ceramic structure 10' and molded along the first opening pattern 11'. On the second ceramic structure 20' a metallic layer 30' is provided to become the base of the first opening pattern 11' while also functioning as an electrode portion, or as illustrated, the metallic layer 30' becomes a sidewall and a bottom of the first opening pattern 11' to respectively function as a reflective sidewall and an electrode portion.

Figure 9A:
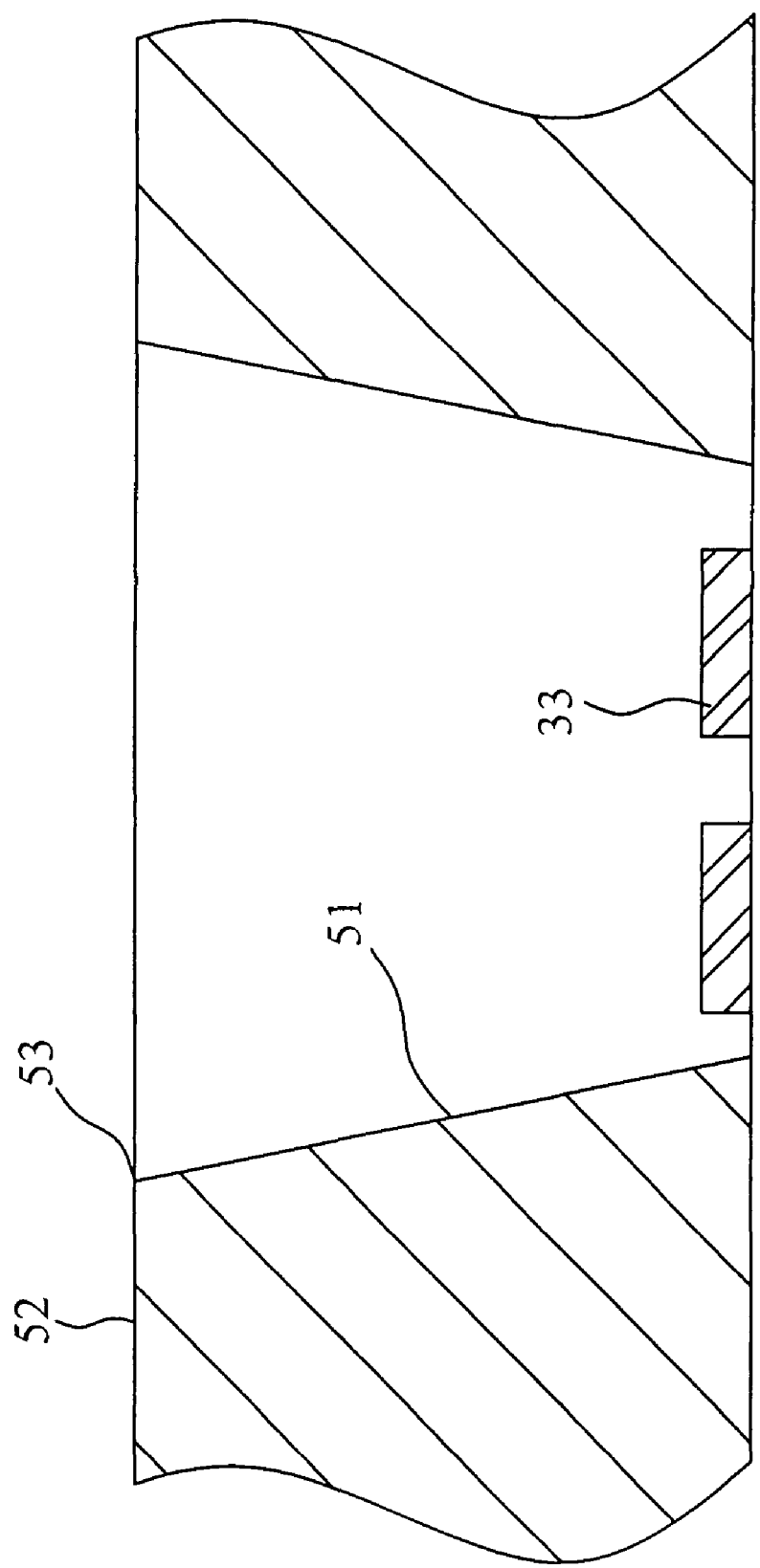
Figure 9B:
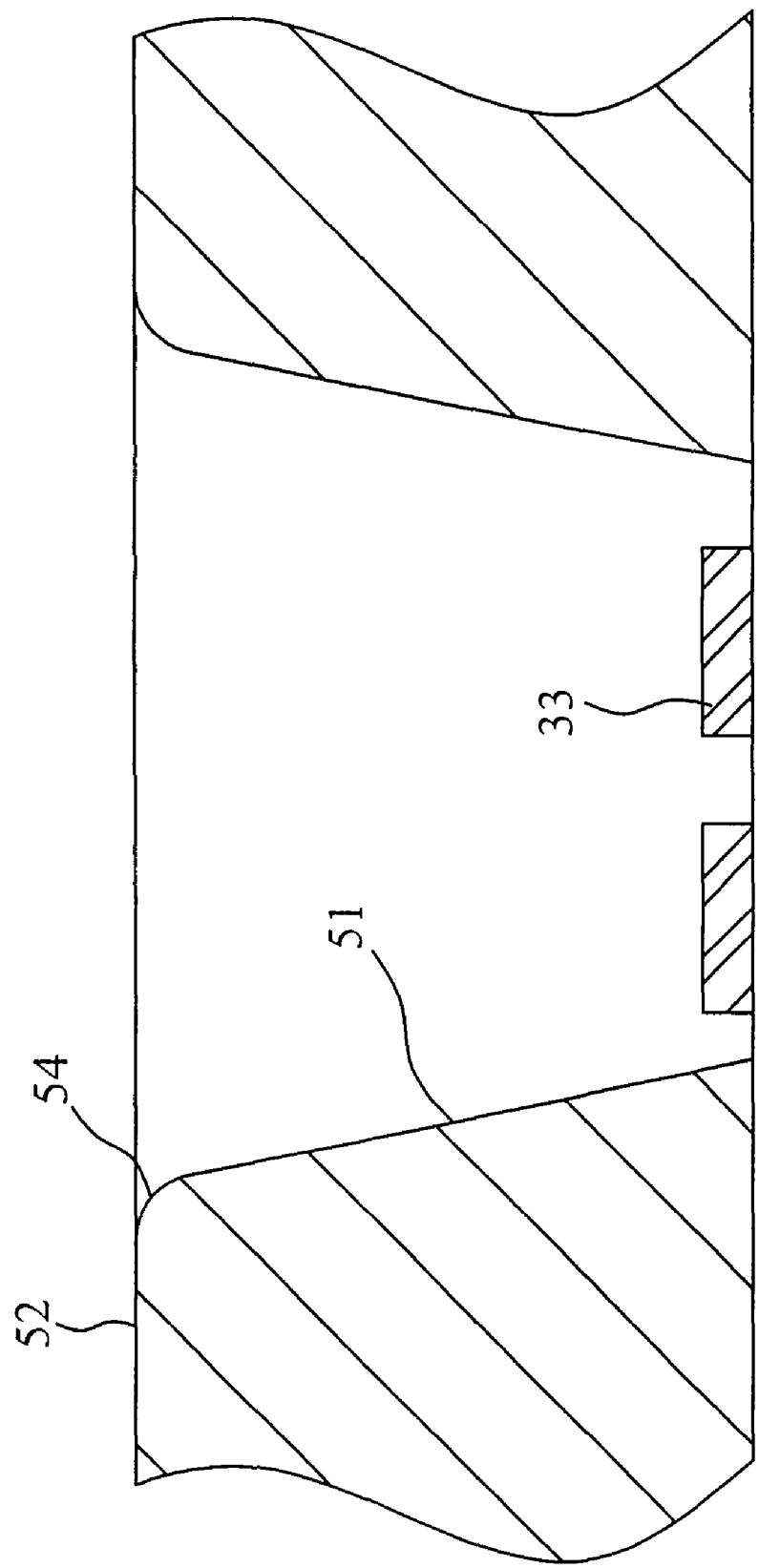
Figure 10B:
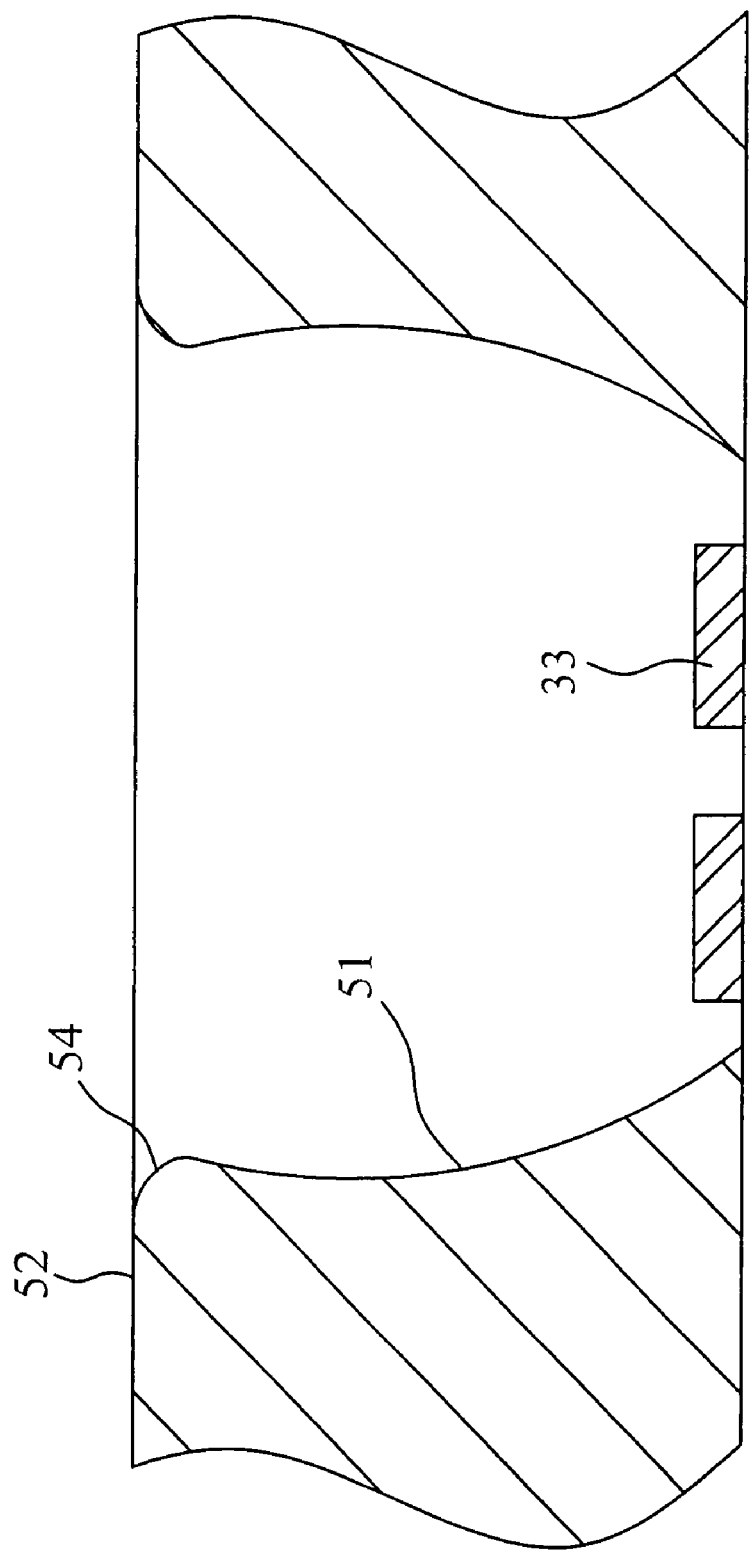
Figure 10C:
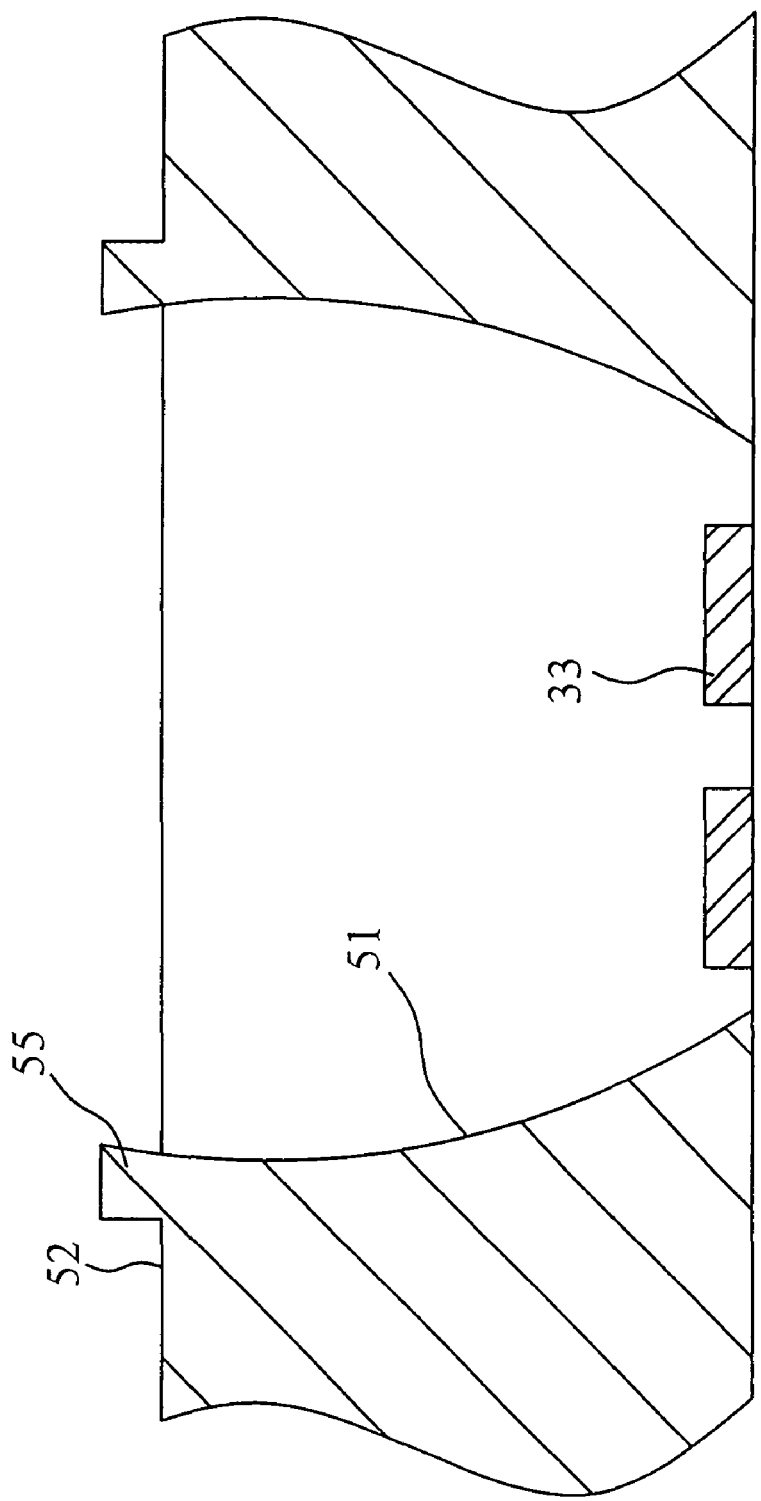
Figure 11:
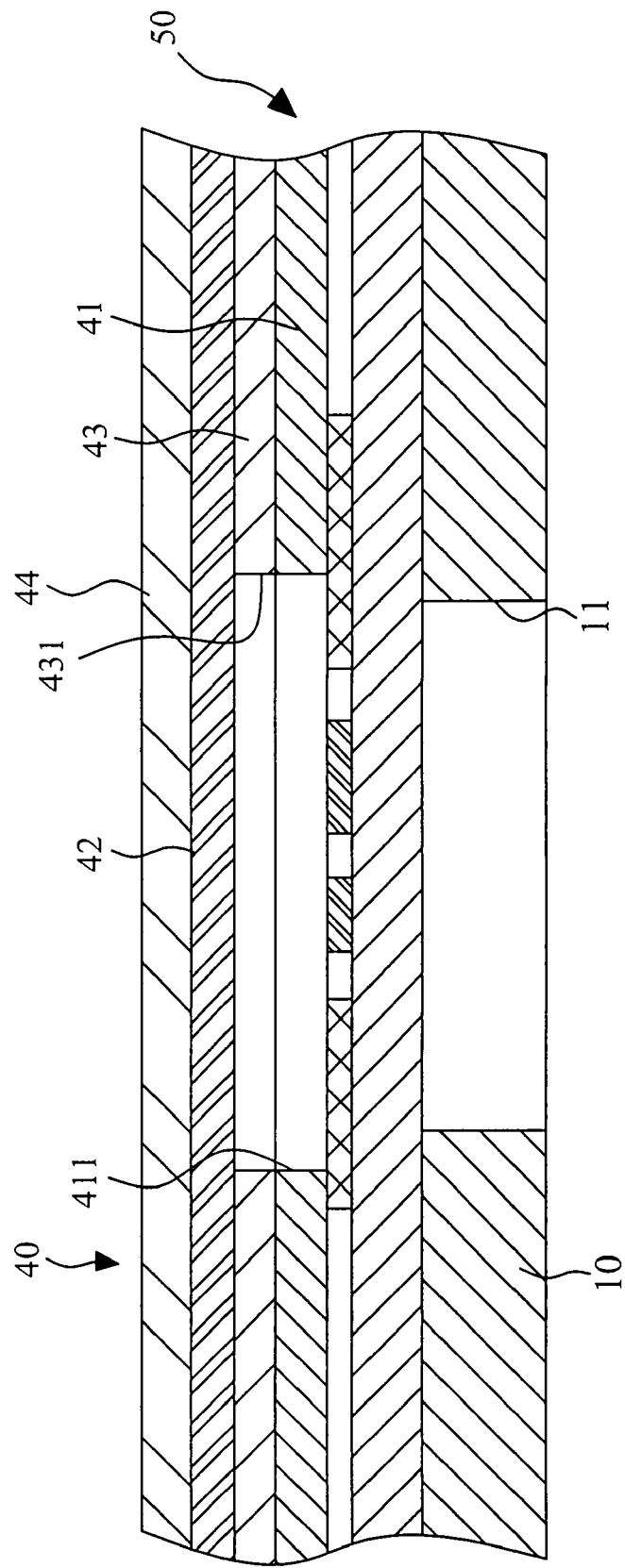
FIG. 11 is another sectional view showing the pack of the reflector material and the molding structure of the present invention.

The shape formed between the sidewall of the reflector and the edge of the opening may vary depending on the size of the porosity each of the second and the third opening patterns respectively of the first release film and the flat layer in the molding structure. As illustrated in FIGS. 9(A) through FIG. 10(C) for sectional views of the geometric forms of the reflector in another preferred embodiment yet of the present invention, a sidewall 51 of the reflector as illustrated in FIGS. 9(A), 9(B), and 9(C) is related to a reflective metallic layer with a given slope; or to a metallic reflector with a curvature as illustrated in FIGS. 10(A), 8(B), and 8(C); and where the edge of the opening crosses a plane of the reflector 52 is related to a general included angle 53 as illustrated in FIGS. 9(A) and 10(A), to an arc 54 as illustrated in FIGS. 9(B) and 9(B), or to a retaining ring 55 to prevent overflowing of epoxy as illustrated in FIGS. 9(C) and 10(C). As also illustrated in FIG. 11, the retaining ring 55 is formed by having greater porosities respectively of the second and the third opening patterns 411 and 431 than the porosity of the first opening pattern 11 so that a structure of the retaining ring 55 is molded in the HIP process. The presence of the retaining ring 55 corrects the problem of overflowing epoxy in the course of LED potting.

Figure 12:
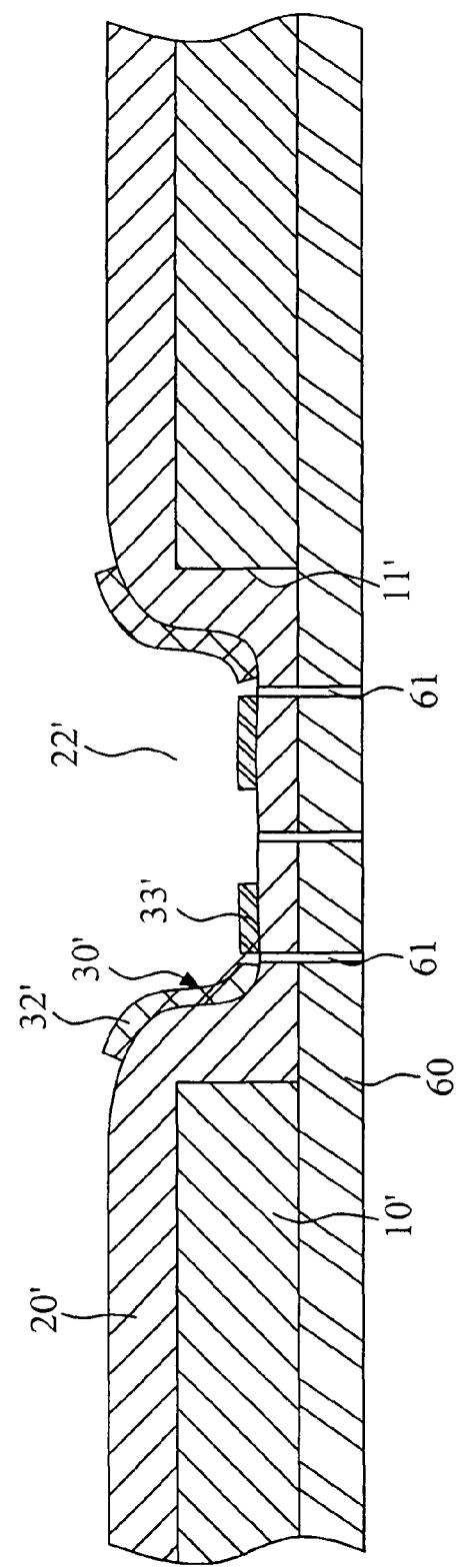
FIG. 12 is a sectional view showing a reflector material structure of another preferred embodiment yet of the present invention.

An LED loader of the reflector may be applied as illustrated in FIG. 12 to contain the first ceramic structure 10' provided with the first opening pattern 11' and the first ceramic structure 10' is covered up with the second ceramic structure 20' by following the shape of the first opening pattern. The second ceramic structure 20' covering upon the first ceramic structure 10' forms a loading concave 22' and the metallic structure 30' is disposed in the inner side of the loading concave 22'. The metallic structure 30' contains a reflective portion 32' and an electrode portion 33' and functions as a reflective sidewall. A base 60 is further disposed to one side of the first ceramic structure 10'. The base 60 is made of a metallic material, and a heat conductive tube 61 is disposed between the base 60 and the second ceramic structure 20' to help facilitate heat dissipation results of the LED.

The prevent invention provides a molding process for an LED reflector and construction thereof, and the application for a patent is duly filed accordingly. However, it is to be noted that the preferred embodiments disclosed in the specification and the accompanying drawings are not limiting the present invention; and that any construction, installation, or characteristics that is same or similar to that of the present invention should fall within the scope of the purposes and claims of the present invention.

We claim:

1. A light emitting diode reflector molding process comprising:

providing a first ceramic green sheet structure, the first ceramic green sheet structure being provided with a first opening pattern along a thickness thereof which has a first sidewall;

placing a second ceramic green sheet structure on top of and in direct contact with the first ceramic green sheet structure, such that the second ceramic green sheet structure has a surface sealing an end of the first opening pattern;

disposing a metallic structure on an opposite surface of the second ceramic green sheet structure opposite to the surface of the second ceramic green sheet structure sealing the first opening pattern; and laminating the second ceramic green sheet structure into the first opening pattern of the first ceramic green sheet structure by using a laminating method such that the metallic structure forms a second sidewall covering completely the first sidewall and constituting a bottom of the first opening pattern, wherein the laminating comprising hot-pressing a molding structure on the second ceramic green sheet structure, wherein the molding structure includes a flat layer disposed between a first release film and a second release film, and a buffer layer disposed on the second release film, and wherein the first release film is used to contact the metallic structure and the second ceramic green sheet structure.

2. The light emitting diode reflector molding process as claimed in claim 1, wherein the first ceramic green sheet structure includes a stack of multiple ceramic green sheet structures with each ceramic green sheet structure being provided with an opening by punching; and all the openings are stacked to form the first opening pattern.

3. The light emitting diode reflector molding process as claimed in claim 1, wherein a second opening pattern and a third opening pattern are respectively disposed to the first release film and the flat layer; the size of the porosity of each of the second and the third opening patterns is the same as or different from that of the first opening pattern; and shape formed between the reflector sidewall and the edge of the opening also varies.

4. The light emitting diode reflector molding process as claimed in claim 3, wherein each size of the porosity of the second and the third opening patterns is greater than that of the first opening pattern to form a retaining ring structure to stop overflowing epoxy in the molding process.

5. The light emitting diode reflector molding process as claimed in claim 1, wherein the metallic structure becomes a conductive or reflective layer after both of the first and the second ceramic green sheet structures having been sintered together; and a plated layer is formed on a surface of the second ceramic green sheet structure by using a plating method.

6. The light emitting diode reflector molding process as claimed in claim 1, wherein the metallic structure becomes a sidewall and a bottom of the first opening pattern.

* * * * *